United States Patent [19]

Godfrey

[11] Patent Number: 4,782,382

[45] Date of Patent: Nov. 1, 1988

[54] HIGH QUANTUM EFFICIENCY PHOTODIODE DEVICE

[75] Inventor: Lawrence A. Godfrey, Ontario, Calif.

[73] Assignee: Applied Solar Energy Corporation, City of Industry, Calif.

[21] Appl. No.: 920,208

[22] Filed: Oct. 17, 1986

[51] Int. Cl.$^4$ .................. H01L 23/02; H01L 23/12
[52] U.S. Cl. .......................................... 357/74; 357/75
[58] Field of Search .......................... 357/74, 75, 17; 174/50.51, 52 H, 50.54, 52 R, 52 PE; 361/380

[56] References Cited

U.S. PATENT DOCUMENTS 4,343,187  8/1982  Kaji ........................................ 73/654
4,675,607  6/1987  Golker et al. ........................ 324/247

OTHER PUBLICATIONS

E. F. Zalewski et al; "Silicon Photodiode Device with 100% External Quantum Efficiency"; Applied Optics; Sep. 15, 1983; vol. 22, No. 18, pp. 2867-2873.

Primary Examiner—James W. Davie
Assistant Examiner—B. Randolph
Attorney, Agent, or Firm—Flehr, Hohbach, Test, Albritton & Herbert

[57] ABSTRACT

High quantum efficiency photodiode device having a pair of photodiodes with light receiving surfaces in parallel spaced relation in a closed cavity. Light is admitted to the cavity through an aperture in such manner that it impinges obliquely upon the light receiving surfaces and is reflected back and forth between the diodes until absorbed. A mirror positioned at the end of the diodes opposite the aperture reflects impinging thereon back to the photodiodes.

7 Claims, 2 Drawing Sheets

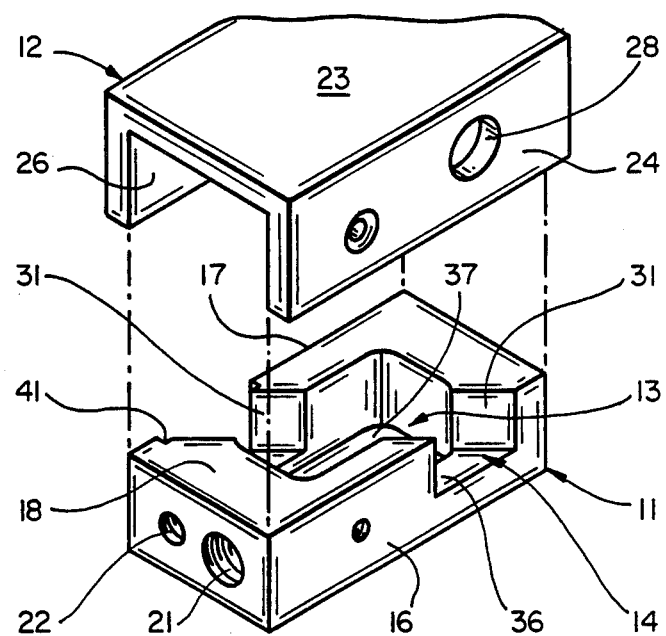
FIG_1
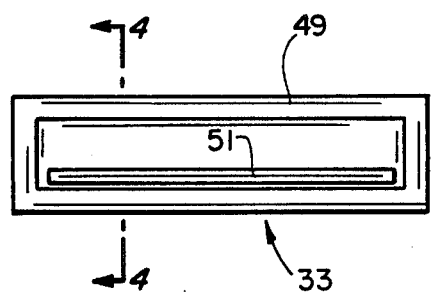
FIG_3

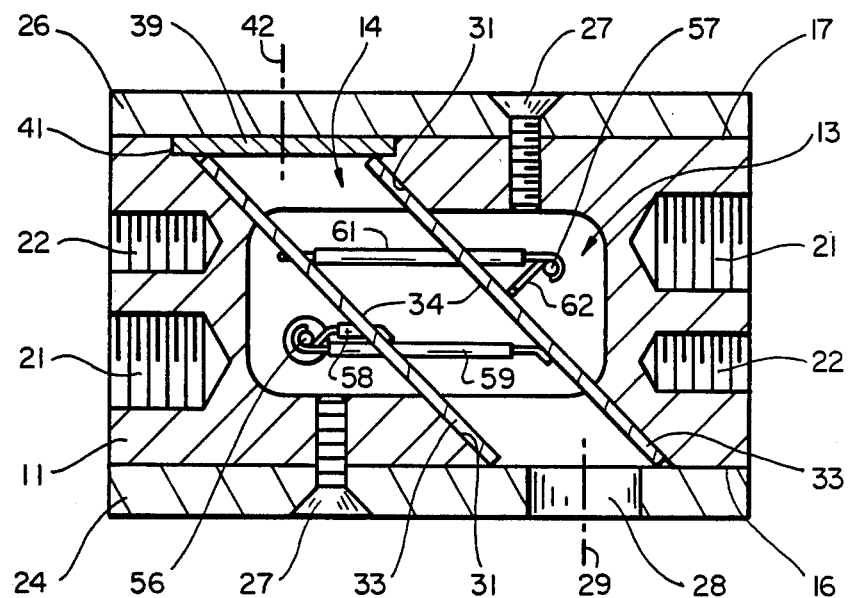
FIG_2
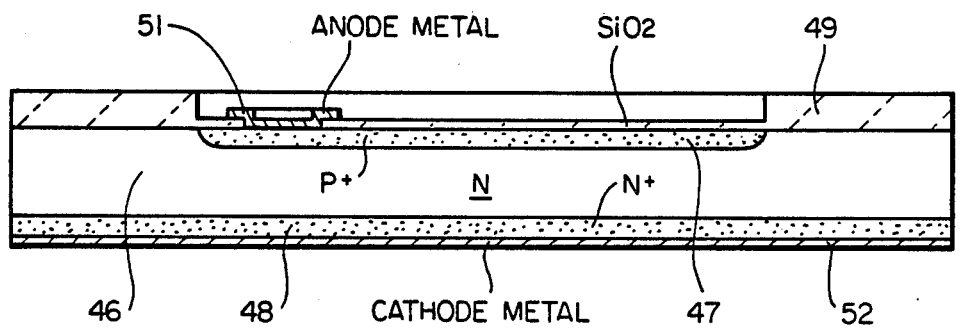
FIG_4

HIGH QUANTUM EFFICIENCY PHOTODIODE DEVICE

BACKGROUND OF THE INVENTION a. Field of the Invention

This invention pertains generally to photodiodes, and more particularly to a photodiode device having a high photon-to-electron conversion (quantum) efficiency.

b. Description of the Related Art

A paper entitled "Silicon photodiode device with 100% external quantum efficiency" by Edward F. Zalewski and C. Richard Duda, *Applied Optics* 22, No. 18, 2867–2873, describes a device utilizing four inversion layer photodiodes in a light trapping arrangement which is said to have a photon-to-electron conversion efficiency of 0.999 for short wavelength and low power visible radiation. Three of the four photodiodes are positioned at right angles to each other in a generally U-shaped configuration, with the fourth photodiodes being inclined at an angle of 45° to the third diode in the group. Radiation impinging upon the first diode in the group at an angle of 45° from the normal is reflected around the group toward the fourth diode where it is reflected back around the group along the same path. While this device provides a relatively high quantum efficiency, it is sensitive to polarization and to the angle of incidence of impinging radiation, and it has a relatively small angle of acceptance (f/22 or more).

It is in general an object of the invention to provide a new and improved photodiode device having a high quantum efficiency.

Another object of the invention is to provide a photodiode device of the above character which can receive impinging radiation over a relatively wide angle of incidence.

Another object of the invention is to provide a photodiode device of the above character which is enclosed and requires no calibration.

SUMMARY OF THE INVENTION

These and other objects are achieved in accordance with the invention by providing a photodiode device having a housing in which a cavity is formed, an aperture in the housing at one end of the cavity for admitting light to the cavity, a plurality of photodiodes having light receiving surfaces positioned in parallel spaced relation on opposite sides of the cavity and being disposed obliquely to the axis of the aperture so that light entering the cavity through the aperture impinges obliquely on one of the light receiving surfaces and is reflected between the light receiving surfaces if not absorbed by one of the photodiodes, and a mirror disposed obliquely to the light receiving surfaces at the end of the channel opposite the aperture for reflecting light impinging thereon back through the photodiodes.

BRIEF DESCRIPTION OF THE DRAWINGS

FIG. 1 is an exploded isometric view of one embodiment of a housing for use in a photodiode according to the invention.

FIG. 2 is an enlarged sectional view of one embodiment of a photodiode device according to the invention.

FIG. 3 is a top plan view of one embodiment of a photodiode for use in the embodiment of FIG. 2.

FIG. 4 is an enlarged cross-sectional view taken line 4—4 in FIG. 3.

DESCRIPTION OF THE PREFERRED EMBODIMENT

As illustrated in the drawings, the photodiode device comprises a housing consisting of a generally rectangular base 11 and a generally U-shaped cover 12. A cavity comprising a generally rectangular central section 13 and an obliquely extending channel 14 is formed in the generally rectangular body. The channel extends at an angle of 45° to the front and rear faces 16, 17 of the body and intersects the central cavity at a similar angle. The central cavity and the channel each open through the top surface 18 of the body, and the channel also opens through the front and rear faces of the body. The central cavity is somewhat deeper than the channel. Threaded mounting holes 21, 22 are provided at the ends of the generally rectangular body.

Cover 12 has a top wall 23 which overlies the top surface 18 of body 11, and front and rear walls 24, 26 which overlie the front and rear faces 16, 17 of the body. The cover is removably mounted on the body and secured by screws 27 to close the cavity within the body. Body 11 and cover 12 are each fabricated of a rigid material such as aluminum with a black anodized coating to minimize the reflection of light by the housing.

An aperture 28 is formed in the front wall of the cover at the front end channel 14, with the axis 29 of the aperture being perpendicular to the front face 16 of the body and oblique to the side walls 31 of the channel.

A pair of photodiodes 33 are mounted in the housing cavity, with the light receiving surfaces 34 of the diodes facing each other in parallel spaced relation. The photodiodes are preferably positioned as close together as possible to maximize light absorption, and the spacing between the diodes is substantially less than the length of the diodes or the channel. The lower edges of the diodes rest upon the bottom walls 36 of channels 14 and are spaced above the bottom wall 37 of central cavity 13. The light receiving surfaces of the photodiodes are inclined at an angle of 45° to the axis of aperture 28 so that light entering the cavity through the aperture will impinge obliquely on one of the light receiving surfaces and be reflected between the light receiving surfaces if not absorbed by one of the photodiodes.

A planar mirror 39 is mounted in a recessed area 41 in body 11 at the rear end of channel 14. The axis 42 of the mirror is perpendicular to the front and rear faces of the body, and the reflective surface of the mirror is parallel to these faces. The mirror is thus disposed at an angle of 45° relative to the light receiving surface of one of the photodiodes 135° relative to the light receiving surface of the other. Light impinging upon the mirror from the photodiodes is reflected back to the photodiodes. The mirror is affixed to the housing body by suitable means such as cementing.

Photodiodes 33 can be any suitable type of photodiode, and FIGS. 3 and 4 illustrate a silicon P or N photodiode which is particularly suitable for use in the invention. This photodiode has a generally rectangular substrate 46 of N-type material, with a P+ diffusion region 47 near the upper surface thereof and an N+ region 48 near the lower surface. The upper surface of the substrate is covered by an $SiO_2$ layer 49 which serves as an antireflection coating and a field oxide. A metallization layer 51 contacts the P+ region through a window in the oxide layer to form an anode for the photodiode, and a metallization layer 52 on the lower surface of the substrate forms the cathode.

Electrically connections to the photodiodes are provided by means of a feedthrough connector 56 and a ground terminal 57 which are mounted in the bottom wall 37 of the central cavity. The photodiodes are positioned with the active areas above the P+ regions facing each other and the anode contacts 51 near the bottom of the cavity. The anode contacts are connected to feedthrough connector 56 by wires 58, 59, and the cathode contacts 52 are connected to ground terminal 57 by wires 61, 62.

The invention has a number of important features and advantages. Light entering the device is reflected back and forth between the photodiodes until it is absorbed. Only about 1% of the light reaches the mirror, and about 95% of that light is reflected back to the photodiodes. Overall, about 99.9% of the impinging light in the range of 650-950 mm is absorbed by the photodiodes. The device will accept light over a relatively wide angle of incidence, e.g. f/8. The device is enclosed and does not require any calibration.

It is apparent from the foregoing that a new and improved photodiode device having a high quantum efficiency has been provided. While only one presently preferred embodiment has been described in detail, as will be apparent to those familiar with the art, certain changes and modifications can be made without departing from the scope of the invention as defined by the following claims.

I claim:

1. In a photodiode device: a housing in which a cavity is formed, an aperture in the housing toward one end of the cavity for admitting light to the cavity, a pair of photodiodes mounted within the housing and having light receiving surfaces positioned in parallel spaced relation on opposite sides of the cavity and being disposed obliquely to the axis of the aperture so that light entering the cavity through the aperture will impinge obliquely on one of the light receiving surfaces and can be reflected between the light receiving surfaces until it is absorbed by one of the photodiodes, and a mirror disposed obliquely to the light receiving surfaces at the end of the cavity opposite the aperture for reflecting light impinging thereon back to the photodiodes.

2. The photodiode device of claim 1 wherein the spacing between the light receiving surfaces is less than the length of the surfaces.

3. The photodiode device of claim 1 wherein the axis of the mirror is generally parallel to the axis of the aperture.

4. The photodiode device of claim 1 wherein the housing comprises a generally rectangular body in which the cavity is formed and a cover mounted on the body over the cavity.

5. In a photodiode device: a generally rectangular body having a central cavity opening through one surface thereof and a channel extending obliquely between opposite sides of the body and intersecting the central cavity, a pair of photodiodes mounted on the side walls of the channel and having generally planar light receiving surfaces facing each other in parallel spaced relation, a mirror positioned at one end of the channel with a reflecting surface generally perpendicular to the opposite sides of said body, a generally U-shaped cover mounted on said body with a central wall adjacent to the one surface of the body and side walls adjacent to the opposite surfaces of the body, and an aperture in the side wall of the cover at the end of the channel opposite the mirror for admitting light to the cavity.

6. The photodiode device of claim 5 wherein the channel extends across the body at an angle on the order of 45° to the opposite sides of the body.

7. The photodiode device of claim 5 wherein the spacing between the light receiving surfaces is less than the length of the channel.

* * * * *